(12) United States Patent
Djemour et al.

(10) Patent No.: US 12,733,458 B2
(45) Date of Patent: Sep. 8, 2026

(54) SEMICONDUCTOR DEVICE WITH TERMINATION STRUCTURE AND FIELD-FREE REGION

(71) Applicant: Infineon Technologies AG, Neubiberg (DE)

(72) Inventors: Rabie Djemour, Munich (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 1071 days.

(21) Appl. No.: 17/737,492

(22) Filed: May 5, 2022

(65) Prior Publication Data

US 2022/0359314 A1 Nov. 10, 2022

(30) Foreign Application Priority Data

May 6, 2021 (EP) .................................... 21172393

(51) Int. Cl.

*H10P 74/00* (2026.01)
*G01K 7/01* (2006.01)
*G01K 7/16* (2006.01)

(52) U.S. Cl.

CPC .............. *H10P 74/273* (2026.01); *G01K 7/01* (2013.01); *G01K 7/16* (2013.01)

(58) Field of Classification Search

CPC ................... H01L 22/32; H01L 23/585; H01L 2224/02166; H01L 2224/0603; H01L 2224/06181; H01L 2224/32225; H01L 2224/48227; H01L 2224/48472; H01L 2924/00014; H10D 30/665; H10D 62/105; H10D 62/107; H10D 62/112; H10D 64/111; H10D 12/441; H10D 30/63; H10D 8/422

See application file for complete search history.

(56) References Cited

U.S. PATENT DOCUMENTS

2011/0025406 A1 2/2011 Kanschat
2012/0305916 A1 12/2012 Liu et al.
2014/0061647 A1 3/2014 Werner
2014/0097431 A1 4/2014 Zundel et al.
2016/0035821 A1 2/2016 Pfirsch et al.
2018/0308973 A1* 10/2018 Ebiike .................. H10D 30/655
2020/0111776 A1* 4/2020 Zeng .................... H10D 12/481

FOREIGN PATENT DOCUMENTS

CN 105280711 A 1/2016
CN 111293166 A 6/2020
WO 2015178024 A1 11/2015

* cited by examiner

*Primary Examiner* — Fernando L Toledo
*Assistant Examiner* — Jorge Andres Lopez
(74) *Attorney, Agent, or Firm* — Murphy, Bilak & Homiller, PLLC

(57) ABSTRACT

A semiconductor device includes a semiconductor portion with a first surface at a front side, wherein the semiconductor portion includes an active area, a termination structure laterally surrounding the active area, and a field-free region between the termination structure and a lateral outer surface of the semiconductor portion. The field-free region includes a probe contact region and a main portion. The probe contact region and the main portion form a semiconductor junction. A probe pad on the first surface and the probe contact region form an ohmic contact. A protection passivation layer on the first surface is formed on at least the termination structure and exposes the probe pad.

19 Claims, 10 Drawing Sheets

103
500
100
310
103
160
103
170
190
B B
350
103

SEMICONDUCTOR DEVICE WITH TERMINATION STRUCTURE AND FIELD-FREE REGION

TECHNICAL FIELD

Examples of the present disclosure relate to a semiconductor device with a termination structure and a field-free region between the termination structure and the lateral outer surface.

BACKGROUND

Power semiconductor devices withstand high blocking voltages. In power semiconductor devices with vertical load current flow, the blocking voltage is applied between a front side electrode at the front side of a semiconductor die and a backside electrode at the opposite side of the semiconductor die. For different reasons, such as imperfections of the crystal lattice at the lateral outer surface of the semiconductor die, a termination structure laterally surrounds the front side electrode and reduces the electric field at the front side in the lateral direction such that the lateral outer surface is approximately field-free.

The continuing demand for decreasing manufacturing costs is driving the trend towards miniaturization of semiconductor devices. At the same time, there is a constant need to increase the reliability of semiconductor devices.

SUMMARY

Embodiments of the present disclosure enable semiconductor device reliability to be improved without increasing the size of the semiconductor device.

To this purpose, an embodiment of the present disclosure relates to a semiconductor device that includes a semiconductor portion with a first surface at a front side. The semiconductor portion includes an active area, a termination structure laterally surrounding the active area, and a field-free region between the termination structure and a lateral outer surface of the semiconductor portion. The field-free region includes a probe contact region and a main portion. A probe pad and the probe contact region form an ohmic contact. The probe contact region and the main portion of the field-free region form a semiconductor junction. A passivation layer on the first surface is formed at least on the termination structure and exposes the probe pad.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a semiconductor assembly and together with the description serve to explain principles of the embodiments. Further embodiments are described in the following detailed description and the claims. Features of the various illustrated embodiments may be combined with each other.

DETAILED DESCRIPTION

Figures 1A, 1B:
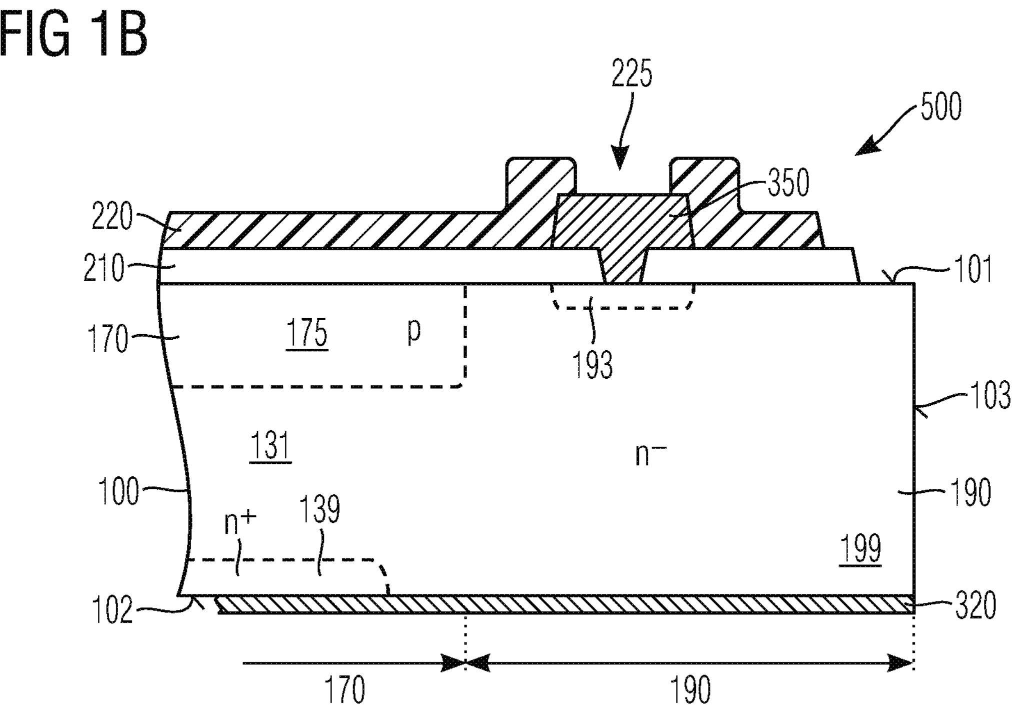
FIGS. 1A and 1B show a schematic plan view and a schematic vertical cross-sectional view of a semiconductor device with a probe pad and a passivation layer exposing a contact surface of the probe pad according to an embodiment.

In the following detailed description, reference is made to the accompanying drawings, which form a part hereof and in which are shown by way of illustrations specific embodiments in which a semiconductor device and a semiconductor assembly may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

An "ohmic contact" is a non-rectifying electrical junction with a linear or almost linear current-voltage characteristic.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor portion form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

A semiconductor device may include a semiconductor portion with a first surface at a front side.

In particular, the semiconductor portion may have two essentially parallel main surfaces, which may have approximately the same shape and size. The semiconductor portion may have a surface extension along two horizontal directions and may have a thickness along a vertical direction perpendicular to the horizontal directions. In the following, the horizontal directions are also referred to as lateral directions. In the following, the main surface at the front side is referred to as first surface and the main surface at the side opposite to the front side is referred to as second surface. A lateral outer surface connects the edge of the first surface with the edge of the second surface.

The semiconductor portion includes a semiconducting part formed from one or more single crystalline semiconductors. For example, the semiconducting part may be formed from silicon, germanium, or a wide bandgap material with a bandgap greater than the bandgap of single-crystalline silicon. In addition to the semiconducting part, the semiconductor portion may include functional structures from other materials like polycrystalline silicon, dielectrics, elemental metals, metal compounds and/or metal alloys. The functional structures may be formed in trenches extending from the first and/or second surface into the semiconductor portion and/or may be formed on the first surface and/or on the second surface.

The semiconductor portion includes an active area, a termination structure laterally surrounding the active area, and a field-free region between the termination structure and the lateral outer surface of the semiconductor portion.

The active area may be formed in a central part of the semiconductor portion and may include the anode region of a power semiconductor diode or the transistor cells of a power semiconductor switch such as an MOSFET (metal oxide semiconductor field effect transistor) or IGBT (insulated gate bipolar transistor).

The termination structure laterally separates the active region and the field-free region and may completely surround the active region laterally. In a blocking mode or in a reverse biased mode of the semiconductor device, the blocking voltage between the active area and the field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof.

The field-free region is formed in an outer periphery of the semiconductor portion between the termination structure and the lateral outer surface. The field-free region directly adjoins the lateral outer surface, wherein the lateral outer surface exposes the field-free region. Alternatively, the field-free region may be formed at a distance to the lateral outer surface of the semiconductor portion and is not exposed along the lateral outer surface. The field-free region may completely separate the termination structure from the lateral outer surface of the semiconductor portion ("chip edge").

The field-free region includes a probe contact region and a main portion, wherein the probe contact region and the main portion form a semiconductor junction.

The probe contact region and the main portion may have different conductivity types, wherein the probe contact region and the main portion form a pn junction. Alternatively, the probe contact region and the main portion may have the same conductivity type, wherein the probe contact region and the main portion form a unipolar junction. The field-free region may include further doped regions of different conductivity types and/or different dopant concentration in addition to the probe contact region and the main portion. The main portion may have a comparatively low mean dopant concentration.

The semiconductor device may further include a probe pad on the first surface. The probe pad may include polycrystalline silicon or may be a metal structure including at least one of an elemental metal, a metal compound and a metal alloy. The probe pad may be sufficiently thick and may have sufficient lateral dimensions to be usable as bond pad.

The probe pad is in contact with the probe contact region. Along an interface to the probe pad, a dopant concentration in the probe contact region is sufficiently high such that the probe pad and the probe contact region form an ohmic contact. For example, the probe pad may include a contact portion extending through an interlayer dielectric to or into the probe contact region.

The semiconductor device may include more than one probe pad. Several probe pads may be combined with one single probe pad region, wherein each probe pad may form an ohmic contact with the probe contact region. Alternatively, several probe pads may be combined with several probe contact regions. In case the number of probe contact regions corresponds to the number of probe pads, each probe pad may form an ohmic contact with another one of the probe contact regions.

The semiconductor device may further include a passivation layer on the front side. The passivation layer is formed on at least a portion of the termination structure and exposes the probe pad.

The passivation layer may be formed directly on the first surface. Alternatively, an interlayer dielectric may be formed between the first surface and the passivation layer.

The passivation layer may further be formed on at least a portion of the field-free region. In addition, the passivation layer may be formed directly on a lateral surface and a horizontal peripheral region of a front side electrode and may be formed directly on a lateral surface and a horizontal peripheral region of a gate pad. The passivation layer exposes a horizontal bond area of the front side electrode and, if applicable, a horizontal bond area of the gate pad.

The passivation layer may be a homogenous layer or may include two or more dielectric sub-layers differing from each other in material composition and/or internal structure. For example, the passivation layer may include sub-layers including silicon oxides and/or silicon nitrides of different density. At least one sub-layer of the passivation layer may be a layer containing polyimide. The layer containing polyimide may be the topmost sub-layer of the passivation layer.

The passivation layer may have an opening exposing at least a horizontal contact surface of the probe pad.

Alternatively, the probe pad may be formed between an outer contour of the passivation layer and the outer lateral surface (chip edge).

The probe pad allows electric access to an otherwise unused area of the semiconductor portion for testing purposes. In combination with the functional electrodes and/or pads of the semiconductor device and/or in combination with one or more additional probe pads, the probe pad enables new electric tests.

For example, by applying a high voltage to the probe pad, the breakdown capability of the termination structure may be selectively assessed. Such tests may be informative in particular when applied to semiconductor devices with a lower breakdown voltage in the active area. Breakdown measurements may be combined with current limiting methods such as a high series resistance for current limitation.

According to another example, the probe pad facilitates a test for cracks that extend into the semiconductor section starting from the lateral outer surface. Alternatively and/or additionally, the probe pad enables recording of the thermal stress to which the semiconductor section is subjected.

For these reasons, the probe pad can help to increase the reliability of the semiconductor device without the need to increase the chip area.

According to an embodiment the probe pad has one single horizontal contour line forming a closed shape.

In other words, the probe pad has topological genus 0 (German: topologisches Geschlecht 0). In particular, the probe pad has no opening(s) extending in vertical direction through the probe pad. For example, the horizontal outline of the probe pad may be a polygon, in particular a rectangle, with or without rounded corners, an ellipse, an oval or a circle.

According to an embodiment the semiconductor device may include a backside electrode formed on the second surface of the semiconductor portion opposite to the front side. The backside electrode and the probe pad are electrically separated.

In other words, no low-resistive ohmic connection exists that directly connects the backside electrode and the probe pad. In particular, an electric path between the backside electrode and the probe pad may include at least one pn junction and applying different potentials to the backside electrode and the probe pad induces not more than a negligible leakage current between the probe pad and the backside electrode, provided that the at least one pn junction is reverse biased.

With the backside electrode and the probe pad electrically separated from each other it is possible to use the probe pad and the backside electrode or a front side structure electrically connected with the backside electrode as electrode pair for a voltage measurement and/or a current measurement.

According to an embodiment a lateral outer contour of the termination structure may be rectangular with rounded corners, wherein the field-free region includes straight sections of uniform width along straight edges of the termination structure and corner sections laterally connecting neighboring straight sections.

According to an embodiment, the probe pad may be formed in one of the corner sections of the field-free region.

The inner radius of the field-free region depends on the voltage blocking capability. For typical power semiconductor devices with blocking voltages greater 600V, the area of the inscribed circle of a corner section is sufficiently large for a rectangular probe pad with edge lengths of at least 60 μm. Placing the probe pad in the corner sections therefore allows reliable access to the probe pad through test probes and/or bond wires without conflict with the front side electrode and, if applicable, with the gate pad.

According to an embodiment, the probe contact region may include a surface portion extending from the first surface into the semiconductor portion.

Typically, cracks that extend from the lateral outer surface into the semiconductor region occur under the action of mechanical shear forces, such as those that occur particularly during wafer dicing. If wafer dicing includes a sawing process, then such cracks often occur near the main surfaces of the semiconductor portion. Accordingly, a probe contact region that includes a surface section detects cracks efficiently.

Alternatively or in addition, the probe contact region may include a buried portion formed along at least a portion of a sidewall and/or a bottom of a filled or non-filled trench extending from the first surface into the field-free region. The buried portion may further improve the sensitivity of tests that detect cracks.

According to an embodiment, the probe contact region may include a ring-shaped portion laterally surrounding the active area and the field termination structure at a distance to a lateral outer surface of the semiconductor portion.

The probe contact region may consist of the ring-shaped portion or may include the ring-shaped portion and a pad-shaped portion. The ring-shaped portion may form a closed ring. A lateral width of the ring-shaped portion may be uniform. The ring-shaped portion may include four straight sections and four bent sections, wherein each bent section connects two neighboring straight sections oriented orthogonally to each other. The distance between the lateral outer surface and the ring-shaped portion may be in a range from 5 μm to 10 μm, by way of example.

In case the probe contact region includes the ring-shaped portion and the pad-shaped portion, the ring-shaped portion and the pad-shaped portion are connected with each other.

The interlayer dielectric and/or the passivation layer may completely cover the ring-shaped portion of the probe contact region. The pad-shaped portion of the probe contact region and the probe pad are formed in a corner section of the field-free region inside or outside the ring-shaped portion.

In case the probe contact region includes only the ring-shaped portion, a contact opening in the interlayer dielectric may expose the ring-shaped portion, the probe pad may be formed on the ring-shaped portion above the opening and a contact portion of the probe pad extends through the opening in the interlayer dielectric, wherein the contact portion of the probe pad and the ring-shaped portion of the probe contact region form a low-resistive ohmic contact.

The ring-shaped portion allows a high efficient test for cracks along the complete circumference of the semiconductor portion.

According to an embodiment, the semiconductor device includes a complementary pad on the first surface, wherein the complementary pad and the field-free region form an ohmic contact.

For example, the field-free region may include a complementary contact region with the same conductivity type as the probe contact region of with the complementary conductivity type of the probe contact region. The complementary contact region and the main portion of the field-free region form a semiconductor junction, e.g. a unipolar junction or a pn junction. The complementary contact region and the complementary pad may form a low-resistive ohmic contact.

The complementary pad and the probe pad may be formed in the same corner section or in different corner sections of the field-free region.

Since for typical power semiconductor devices the area of the inscribed circle of each corner section is sufficiently large for a rectangular probe pad with edge lengths of at least 60 μm, placing the complementary pad in the corner section allows two-electrode measurements without conflict with the front side electrode and, if applicable, with the gate pad even if none of the backside electrode, the front side electrode and the gate pad is usable for the measurement/test.

According to an embodiment, the complementary pad and the backside electrode may be electrically connected.

For example, the semiconductor device may include a ring-shaped metal structure forming an ohmic contact with the field-free region, wherein the metal structure forms a metal potential ring (field plate) surrounding the active area and the termination region.

The metal structure may function as the complementary pad. Alternatively, the metal structure and the complementary pad may be different, electrically connected structures.

Using the metal potential ring as second electrode allows two-electrode measurements without conflict with the mandatory device pads without providing additional pads.

According to an embodiment, the field-free region may include a complementary contact region of the conductivity type of the probe contact region, wherein the complementary pad and the complementary contact region form an ohmic contact.

With the probe contact region and the complementary contact region having the same conductivity type, the complementary pad and the probe pad facilitate electric measurements of the part of the semiconductor portion between the complementary contact region and the probe contact region, wherein exclusively corner sections of the field-free region are used.

According to an embodiment, the field-free region may include a resistor region of the conductivity type of the probe contact region, wherein the resistor region connects the probe contact region and the complementary contact region. The resistor region, the pad contact region and the complementary contact region may have the same conductivity type as the field-free region main portion.

In particular, the resistor region, the pad contact region and the complementary contact region may have the conductivity type complementary to the conductivity type of the field-free region main portion. Then the pn junction between the resistor region and the field-free region main portion may reduce the influence of the field-free region main portion on the resistance measurement and the precision of the temperature measurement can be increased.

The complementary pad and the probe pad facilitate measurement of the electric resistance of the part of the resistor region between the probe contact region and the complementary contact region. Since the electric resistance of the resistor region depends on the temperature, the resistor region allows recording the thermal stress the semiconductor device is subjected to.

In case the semiconductor device is a semiconductor diode, measurement of the resistance of the resistor region may start shortly after transition into the reverse biased mode. In case the semiconductor device is an IGBT, the electric resistance may be measured outside the on-state periods, such that the measurement is not affected by the charge carrier plasma which in the on-state may laterally spread into the field-free region. In the reverse-biased state of the semiconductor diode and in the blocking state of an IGBT, the field-free region is free of electric fields that may disturb the measurement.

Steadily monitoring the temperature decay within the blocking state may give further information as regards the state-of-health of the semiconductor device. For example, when aging increases a thermal resistance between semiconductor portion and lead frame, the semiconductor portion cools down at a slower rate. With the resistor region formed in the field-free region, such information can be obtained without increasing chip area.

According to an embodiment, the field-free region may include a complementary contact region of the opposite conductivity type of the probe contact region, wherein the complementary pad and the complementary contact region form an ohmic contact.

A doped diode transition region may connect the pad contact region and the complementary contact region and may have the conductivity type of the pad contact region or the conductivity type of the complementary contact region.

The pn junction between the diode transition region and the probe contact region or between the diode transition region and the complementary contact region has a temperature dependent knee voltage. For example, the knee voltage may decrease by about 2 mV when the temperature of the concerned part of the semiconductor portion rises by 1 K.

According to an embodiment, the semiconductor device further includes a bond wire electrically connecting the probe pad with a further conductive structure.

The further conductive structure may be a distinct device lead or device terminal. Alternatively, the further conductive structure may be a bond pad on another semiconductor device, wherein the other semiconductor device may be a measurement device suitable for generating appropriate measurement signals. Further in the alternative, the further conductive structure may be a bond support structure on a PCB or on a DCB substrate, wherein the bond support structure may be integrated in a module, e.g. an IGBT module.

In an application, the bond wire facilitates access to the probe pad during operation of the semiconductor device.

According to another embodiment semiconductor assembly may include any of the semiconductor device as described above and a measurement circuit. The measurement circuit includes a first test port electrically connected to the probe pad and a second test port electrically connected to a load electrode, e.g. a front side electrode or a backside electrode. The measurement circuit measures a current delivered or absorbed through the first test port. Alternatively of in addition, the measurement circuit measures a voltage between the first and second test ports.

In particular, the measurement circuit may be configured to apply a voltage between the probe pad and the load electrode and to simultaneously measure a current delivered or absorbed by the probe pad. Alternatively or in addition, the measurement circuit may be configured to deliver a current to or absorb a current from the probe pad and to simultaneously measure a voltage between the probe pad and the load electrode.

The measurement circuit may be connected directly to the load electrode of the tested semiconductor device or to another conductive structure which is electrically connected to the load electrode. The other conductive structure may be a load electrode of a further semiconductor device, wherein the load electrode of the further semiconductor device and the load electrode of the tested semiconductor device are directly electrically connected, e.g. through a bond wire.

A mode of operation of the semiconductor assembly may include determining, in-situ, a temperature of the semiconductor device by measuring a temperature-dependent knee voltage of a pn junction accessible through the probe pad and/or a temperature-dependent resistance of a resistor region accessible through the probe pad and outputting temperature data indicative for the temperature.

A further embodiment includes recording a cumulated thermal stress the semiconductor device has been exposed to and outputting thermal stress data indicative for the cumulated thermal stress.

According to a further embodiment determining the thermal stress data includes assessment of the temperature measurement in time periods synchronized with transitions to turn-off periods of the semiconductor device.

A further embodiment refers to a semiconductor test assembly equipped with any of the semiconductor devices as described above. A test adapter includes at least one needle probe that is suitable for making electric contact with the probe pad. A leakage current measurement device may measure a leakage current delivered or absorbed through the probe pad.

FIGS. 1A and 1B show a semiconductor device 500 with a semiconductor portion 100. The semiconductor portion 100 includes a semiconducting part formed from one or more single crystalline semiconductor(s). The semiconductor(s) may include group IV elemental semiconductors, e.g. silicon (Si) or germanium (Ge), group IV compound semiconductors, e.g. silicon carbide (SiC) or silicon germanium (SiGe), or group III-V semiconductors such as gallium nitride (GaN), aluminum gallium nitride (AlGaN) or gallium arsenide (GaAs), by way of example. In particular, the semiconductor may be a wide-bandgap semiconductor with a bandgap of at least 2 eV. For example, the semiconductor may be SiC with a hexagonal polytype like 2H-SiC, 4H-SiC or 6H-SiC. In addition to the main constituent or the main constituents, the semiconductor may include dopant atoms, for example nitrogen (N), phosphorous (P), beryllium (Be), boron (B), aluminum (Al) and/or gallium (Ga). The semiconductor may also include other impurities such as hydrogen (H), fluorine (F) and/or oxygen (O).

A first surface 101 at the front side of the semiconductor portion 100 and a second surface 102 at the opposite side are essentially parallel to each other and have approximately the same shape and size. A lateral outer surface 103 connects the edge of the first main surface 101 and the edge of the second main surface.

The semiconductor portion 100 has a surface extension along two horizontal directions. The horizontal directions are parallel to an x-axis and to a y-axis, wherein x-axis and y-axis are orthogonal to each other. The semiconductor portion 100 has a thickness along a vertical direction perpendicular to the horizontal directions. The vertical direction is parallel to a z-axis, which is orthogonal to the x-axis and to the y-axis. In the following, the horizontal directions are also referred to as lateral directions.

The semiconductor device 500 is a power semiconductor diode with a p doped anode region formed in an active area 160 in a central part of the semiconductor portion 100. A termination structure 170 surrounding the active area 160 includes a p-doped junction termination extension region 175 extending from the first surface 101 into the semiconductor portion 100. A field-free region 190 laterally separates the termination structure 170 and the lateral outer surface 103.

A heavily n doped contact region 139 may extend from the second surface 102 into the semiconductor portion 100. The contact region 139 may be formed exclusively in the active area 160. Alternatively, the contact region 139 may extend laterally beyond the active area 160, for example to or into the field-free region 190 or to the lateral outer surface 103.

The active area 160 includes a voltage sustaining structure between the anode region and the contact region 139. The voltage sustaining structure may include a charge compensation structure and/or a lightly n doped drift zone 131. The voltage sustaining structure extends laterally beyond the active area 160, for example to the field-free region 190.

The field-free region 190 includes an n conductive main portion 199 and a probe contact region 193, wherein the probe contact region 193 extends from the first surface 101 into the semiconductor portion 100. The main portion 199 and the drift zone 131 may have the same conductivity type and dopant concentration. The probe contact region 193 may have the same conductivity type as the drift zone 131 or the complementary conductivity type. The probe contact region 193 and the main portion 199 form a semiconductor junction, which may be a unipolar junction or a pn junction.

An interlayer dielectric 210 may be formed on the first surface 101. The interlayer dielectric 210 covers at least a portion of the termination structure 170 and a portion of the field-free region 190. A first opening in the interlayer dielectric 210 exposes at least a portion of the active area 160. A second opening in the interlayer dielectric 210 exposes the probe contact region 193. The interlayer dielectric 210 may include one single homogeneous layer or may include two or more sub-layers of different composition and/or different density or stoichiometry.

A front side electrode 310 formed on the front side of the semiconductor portion 100 extends through the first opening in the interlayer dielectric 210 and is in contact with the anode region, wherein the anode region and the front side electrode 310 form an ohmic contact. The front side electrode 310 forms the anode of the power semiconductor diode.

A probe pad 350 formed on the front side of the semiconductor portion 100 extends through the second opening in the interlayer dielectric 210 and is in contact with the probe contact region 193

A backside electrode 320 is formed directly on the second surface 102 of the semiconductor portion 100. The backside electrode 320 and the heavily doped contact layer 139 form an ohmic contact. The backside electrode 3220 forms the cathode of the power semiconductor diode.

A passivation layer 220 is formed on the first surface 101. The passivation layer 220 is formed directly on a portion of the interlayer dielectric 210 above the termination structure 170 and the field-free region 190. The passivation layer 220 may cover lateral surfaces and peripheral sections of horizontal surfaces of the front side electrode 310 and the probe pad 350. A first opening in the passivation layer 220 exposes a bond area of the front side electrode 310. A second opening in the passivation layer 220 exposes a contact surface of the probe pad 350. The passivation layer 220 includes one single homogeneous layer or includes two or more sub-layers of different composition and/or different density or stoichiometry. In particular, the passivation layer 220 includes an imide layer.

In combination with the probe contact region 193 and one of the load electrodes 310, 320 or one or further pads, the probe pad with the exposed contact surface facilitates various measurements and tests.

Figure 2A:
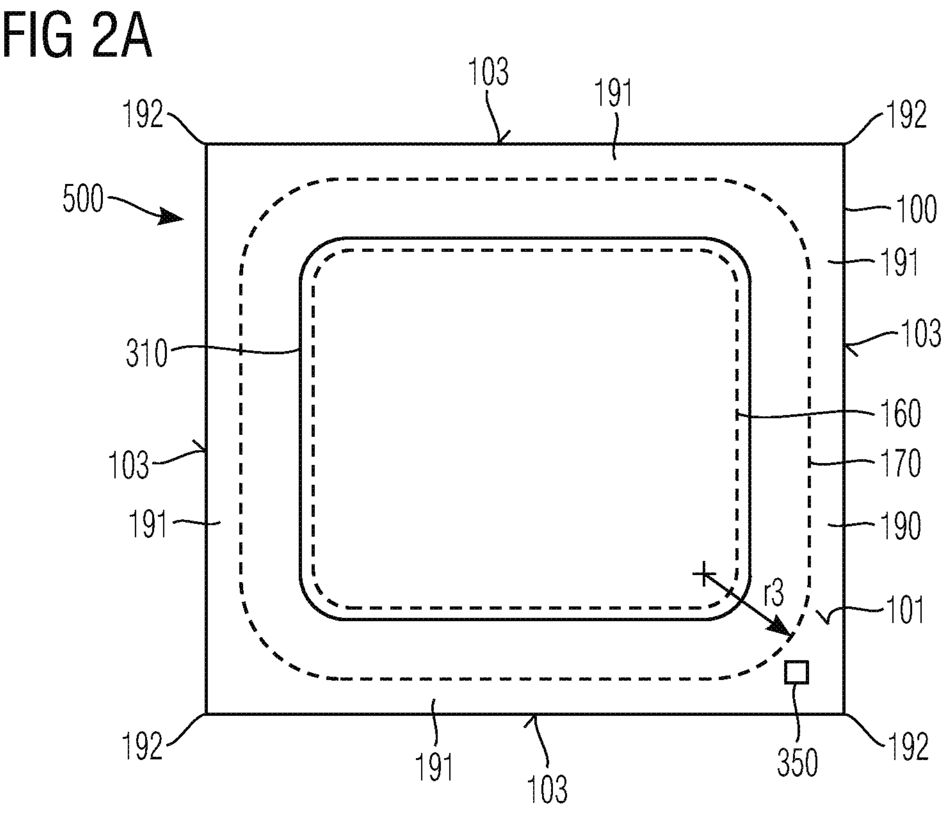
FIGS. 2A and 2B show a schematic plan view and a schematic vertical cross-sectional view of a semiconductor device according to an embodiment with the probe pad formed in a corner section of the field-free region.

FIG. 2A shows a semiconductor device 500 with a probe pad 350 with rectangular horizontal cross-section and with a termination structure 170, which outer contour is rectangular with rounded corners.

Accordingly, the field-free region 190 includes four straight sections 191 of uniform width along straight edges of the termination structure 170 and four corner sections 192 laterally connecting neighboring straight sections 191.

The lateral corners of the active area 160 are rounded to avoid field crowding. The radius of the rounded corners is selected such that no premature voltage breakdown occurs in the corners of the active area 160 and the breakdown voltage in the corners is at least as high as elsewhere in the active area. For example, in case the semiconductor portion 100 is based on silicon, a radius of the rounded corners of the active area 160 is typically in the range of the thickness of the semiconductor portion 100.

Further, a lateral width of the termination structure 170 is selected such that no premature lateral voltage breakdown occurs. For example, in case the semiconductor portion 100 is based on silicon, the lateral width of the termination structure 170 is typically in the range of 150% to 500% of the thickness of the semiconductor portion 100. As a consequence, the outer corner radius r3 of the termination structure 170 is in the range of about the 2.5 fold to 10 fold of the thickness of the semiconductor portion 100.

For a silicon-based semiconductor device 500 with a blocking voltage of 1200V the thickness of the semiconductor portion 100 is about 120 μm and the outer corner radius r3 may be in a range from 300 μm to 1.2 mm. As a result, in the corner sections 192 of the field-free region 190 is enough space for quadratic pads with an edge length of at least 100 μm in the area between the chip edge and the rounded outer edge of the termination structure 170.

Figure 2B:
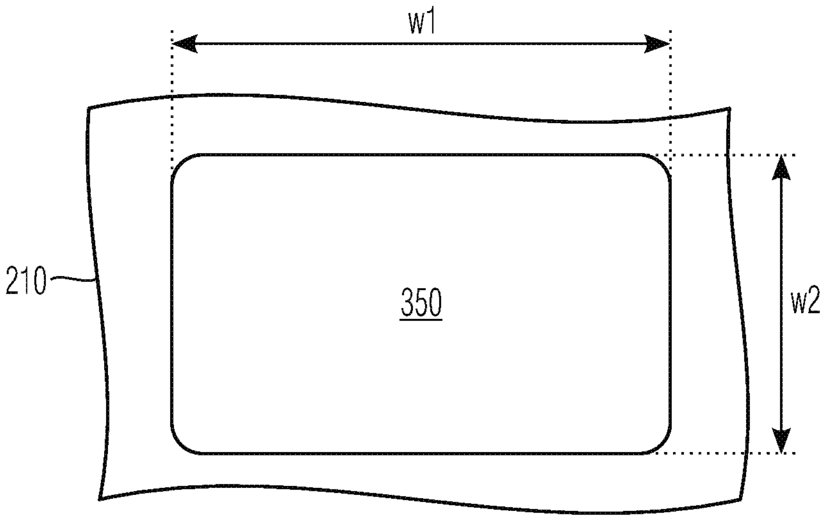

According to FIG. 2B, the outer contour of the probe pad 350 in the horizontal cross-sections is defined by one single closed line. The probe pad 350 has a first width w1 along the x direction and a second width along the y direction. The first width w1 is in the range from 60 μm to several 100 μm. The second width w2 is in the range from 60 μm to several 100 μm. The first width w1 and the second width w2 may be equal.

Figure 3:
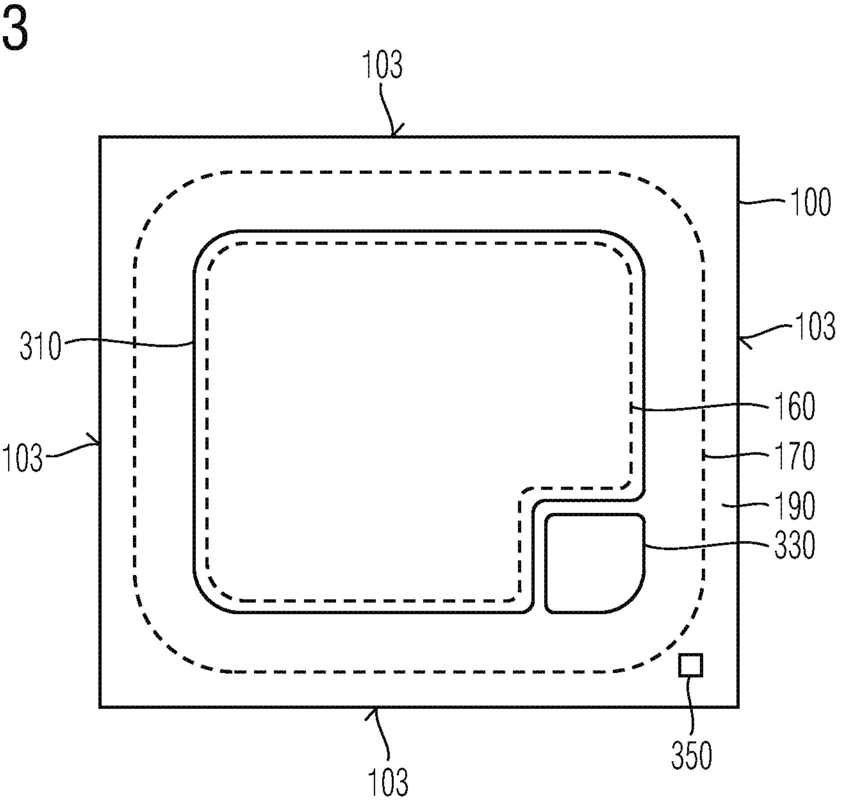
FIG. 3 shows a schematic plan view of a semiconductor device according to an embodiment concerning a semiconductor switching device.

In FIG. 3 the semiconductor device 500 is a switching device, e.g. an MOSFET or IGBT and includes a control head formed in the active area 160 along the first surface 101. The control head includes a plurality of transistor cells TC electrically arranged in parallel, wherein each transistor cell TC includes a source region of a first conductivity type and a body region of a complementary second conductivity type. The body regions of the transistor cells may be portions of a body well. Each source region may be formed between the first surface 101 and the body region of the transistor cell TC. In addition, each transistor cell TC includes a gate structure that may extend from the first surface 101 into the semiconductor portion 100. Each gate structure includes a conductive gate electrode electrically connected to a gate pad 330 and a gate dielectric capacitively coupling the gate electrode and the body region.

Figure 4:
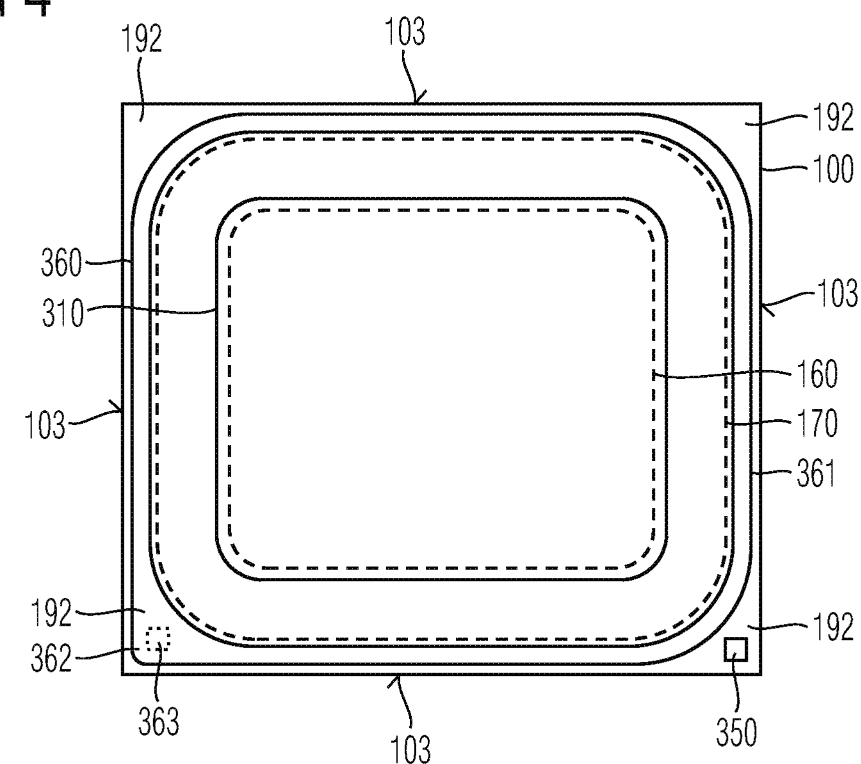
FIG. 4 shows a schematic plan view of a semiconductor device according to an embodiment with a complementary pad including a ring-shaped portion.

In FIG. 4 the semiconductor device 500 includes a drain ring 360 formed at the front side. The drain ring 360 may uniformly distribute a certain potential, e.g. the potential of the backside electrode 320 (see FIG. 1B). The drain ring 360 may include a part formed on the first surface 101 and/or a part in the semiconductor portion 100. The drain ring 360 may include heavily doped polycrystalline silicon, an elemental metal, a metal alloy and/or a metal compound forming a field plate on the first surface 101 above an outer portion of the termination structure 170 or an inner portion of the field-free region 190, wherein the field plate may electrically contact the semiconductor portion 100 in the field-free region 190. Additionally or alternatively, the drain ring 360 may include a heavily n doped or heavily p doped channel stopper region extending from the first surface 101 into the semiconductor portion 100.

The drain ring 360 includes a line portion 361 of uniform lateral width and an approximately triangular portion 362 in at least one of the lateral corners of the first surface 101. In the triangular portion 362, a third opening in the passivation layer 220 may expose a drain ring contact area 363.

The drain ring contact area 363 and the contact surface of the probe pad 350 provide access to doped regions in the field-free region 190 for test probes and/or bond wires and facilitate measurements concerning the electric properties of such doping regions in the field-free region 190 which are in contact with the drain ring 360 and the probe pad 350.

Figure 5A:
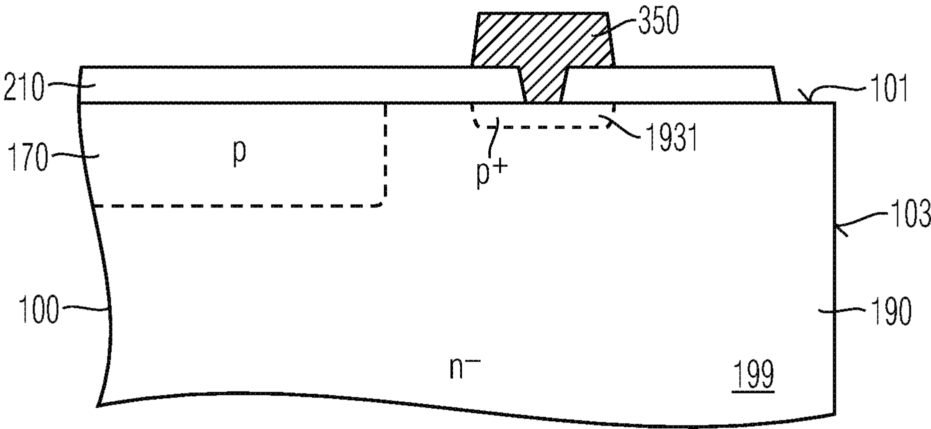
FIGS. 5A and 5B show a schematic plan view and a schematic vertical cross-sectional view of a semiconductor device according to an embodiment with a probe contact region formed at a distance to the horizontal main surfaces of the semiconductor portion.

FIG. 5A shows a semiconductor device with the probe contact region 193 including a surface portion 1931 extending from the first surface 101 into the semiconductor portion 100.

Figure 5B:
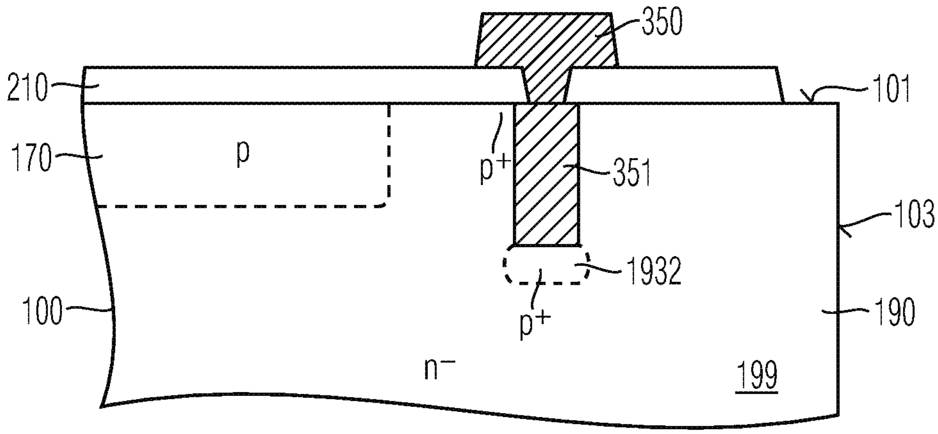

In FIG. 5B the probe contact region 193 includes a buried portion 1932 formed along a bottom of a filled trench 351 that extends from the first surface 101 into the field-free region 190. The filled trench 193 includes a conductive material such that the buried portion 1932 and the probe pad 350 are electrically connected.

Figures 6A, 6B:
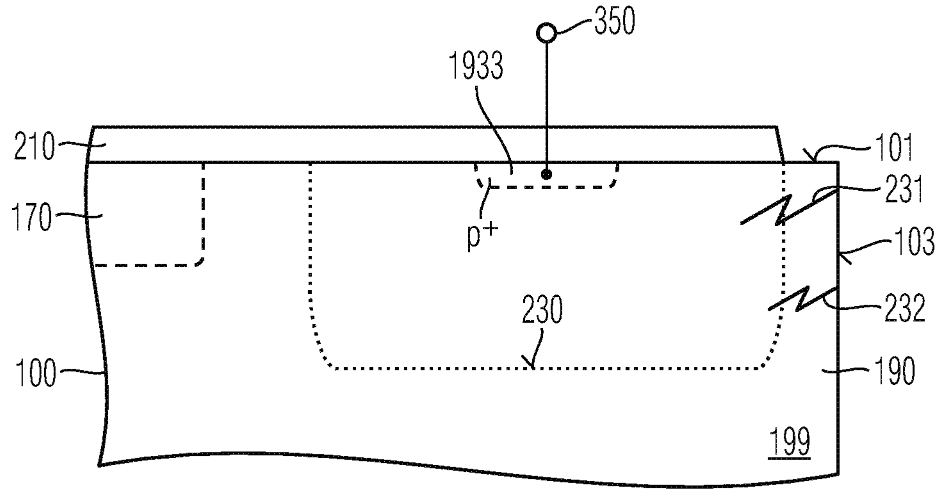
FIGS. 6A and 6B show a schematic plan view and a schematic vertical cross-sectional view of a semiconductor device according to an embodiment with a ring-shaped probe contact region for detecting cracks extending from the lateral outer surface into the semiconductor portion.

In FIGS. 6A and 6B the probe contact region 193 includes a ring-shaped portion 1933 and a pad portion 1934. The ring-shaped portion 1933 laterally surrounds the active area 160 and the termination structure 170 at approximately uniform distance to the lateral outer surface 103 of the semiconductor portion 100. The pad portion 1934 is formed in a corner section 192 of the field-free region 190. The probe pad 350 is formed above the pad portion 1934, wherein the probe pad 350 and the pad portion 1934 form an ohmic contact. The probe contact region 193 and the main portion 199 of the field-free region 190 form a pn junction.

A test is performed after dicing or later in an assembly process, but prior to molding or potting.

For the test, a first test probe is brought into contact with the probe pad 350 and a second test probe is brought in contact with a structure electrically connected with the main portion 199, e.g. with the drain electrode in case the semiconductor device 500 is a MOSFET or with the cathode electrode in case the semiconductor device 500 is a power semiconductor diode. Then a positive voltage is applied between the second test probe and the first test probe such that the pn junction between the probe contact region 193 and the main portion 199 is reverse biased, and a current flow across the pn junction is measured.

When the pn junction between the main portion 199 and the probe pad region is reverse-biased, a depletion zone (space charge zone) forms on both sides of the pn junction. The depletion zone is mainly formed in the more lightly doped main portion 199. A dotted line 230 marks the boundary of the depletion zone under a suitable reverse bias. The reverse bias and the lateral distance between the probe pad region 193 and the lateral outer surface 103 are selected such that a non-depleted part of the main portion 199 separates the depletion zone and the lateral outer surface 103.

Typical high voltage power semiconductor devices have a substrate doping of only 2 . . . 20E13/$cm^3$. Assuming a doping in the main portion 199 of the field-free region of about 5E13/$cm^3$ and an abrupt pn-junction between the main portion 199 and the pad contact region 193, a reverse-bias of 4V is sufficient to span a depletion region of about 10 μm. A reverse bias of 4V corresponds to an electric field of about 7 kV/cm at the pn junction. An electric field of 7 kV/cm is only 3% of the critical electric field in silicon. The electric field is therefore sufficiently low to safely avoid avalanche breakdown at the pn junction.

In case the semiconductor crystal is intact, only very small leakage current flows between the main portion 199 and the probe contact region 193. However, crystal defects 231, 232 extending into the depletion zone significantly increase the leakage current between the main portion 199 and the probe contact region 193. Therefore the value of the leakage current of the reverse-biased pn junction between the main portion 199 and the probe contact region 193 can be used as sorting criterion for discarding a faulty semiconductor portion 100 from subsequent manufacturing processes.

Several manufacturing process may produce crystal defects near the lateral outer surface of the semiconductor portion 100. For example, wafer dicing by sawing may induce cracks extending from the lateral outer surface into the semiconductor portion 100. In addition, during transport and handling of a semiconductor die obtained by dicing and during various assembly processes the lateral outer surface 103 may suffer mechanical damage through sawing blades or by knock-on of the chips. Such mechanical damage may lead to crystal damage and subsequently to field failures.

For example, typical mechanical dicing results in crystal damage in a narrow edge damage portion of the semiconductor portion, wherein the edge damage portion has a width of about 5 μm or 10 μm. By contrast, at certain abnormal situations, damage such as cracks 231, 232 may reach significantly deeper into the semiconductor portion 100. By defining a lateral edge of the depletion region at the applied reverse bias laterally outside the edge damage portion but sufficiently close to the edge damage portion, a low leakage current across the pn junction indicates a good dicing process and a high leakage current across the pn junction indicates a pre-damaged semiconductor portion and/or a faulty dicing process.

The ring-shaped portion of the pad contact region allows reliable electric screening at low test voltages after dicing and even after wire bonding.

For the use with test probes, the contact areas of the probe pad 350 and the probe pad 350 may be comparatively small compared to pads sized for wire bonding.

Figure 7A:
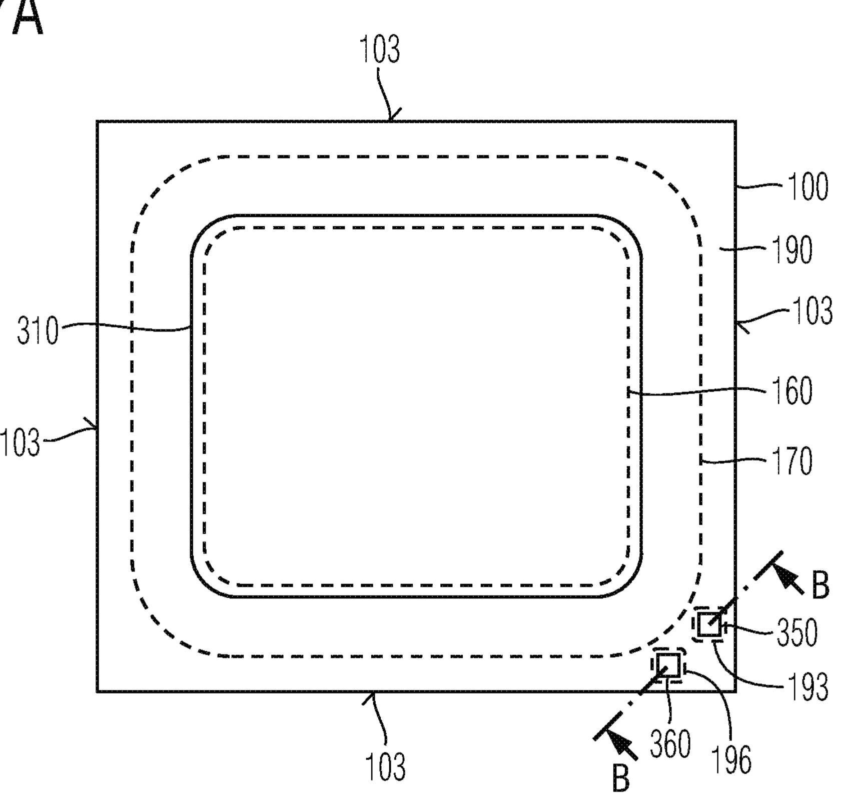
FIGS. 7A and 7B show a schematic plan view and a schematic vertical cross-sectional view of a semiconductor device according to an embodiment with a complementary pad for sensing a temperature-dependent voltage value.
Figure 7B:
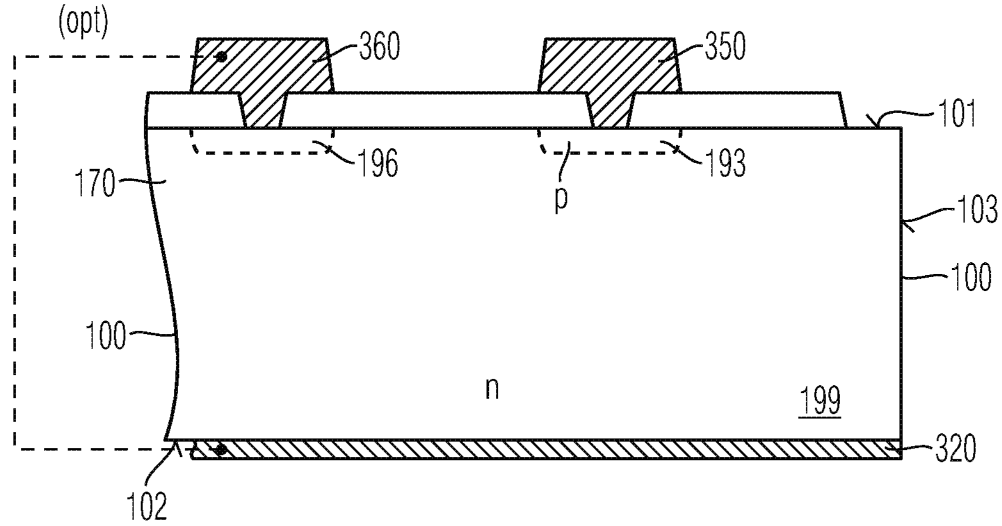

FIGS. 7A and 7B show a semiconductor device 500 with a complementary pad 360 formed on the first surface 101. The complementary pad 360 may include heavily doped polycrystalline silicon, an elemental metal, a metal allow and/or a metal compound. A complementary contact region 196 extends from the first surface 101 into the field-free region 190. The complementary pad 360 and the complementary pad region 196 form an ohmic contact.

The complementary pad region 196 and the main portion 199 0f the field-free region 190 form a semiconductor junction, e.g. a unipolar junction or a pn junction.

The complementary pad 360 and the backside electrode 320 on the second surface 320 may be electrically connected. In addition or alternatively, the passivation layer 220 may include a further opening exposing a horizontal contact surface of the complementary pad 360.

The probe pad 350 and the complementary pad 350 facilitate various electrical measurements in the field-free region 190 during the manufacturing process and/or during the operational time of the semiconductor device.

Figure 8A:
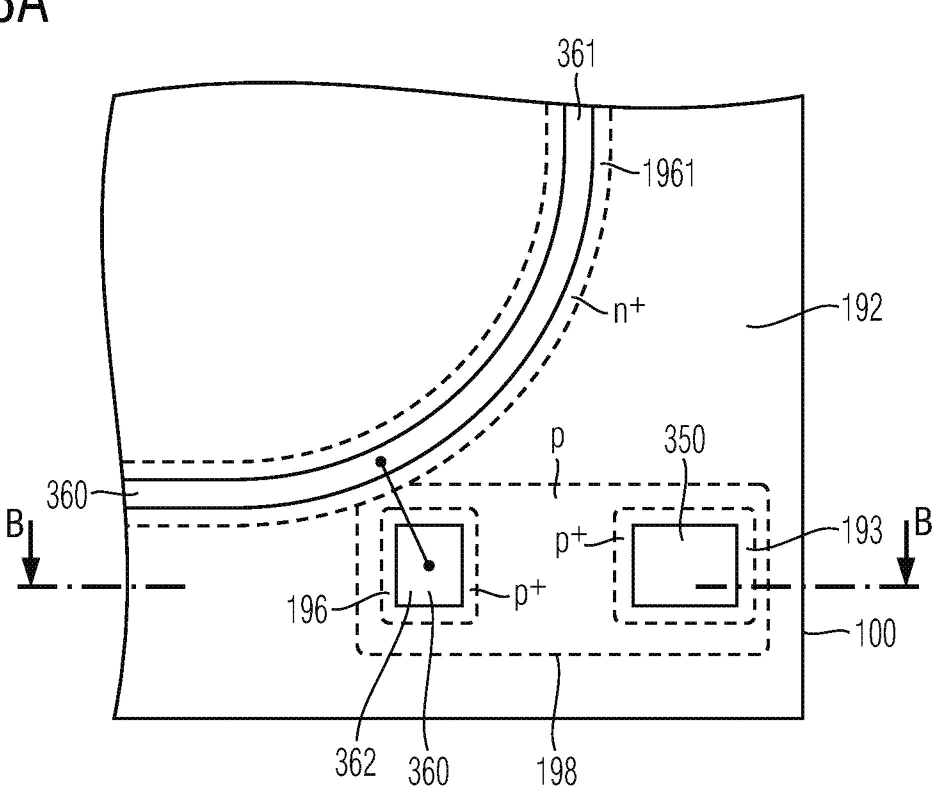
FIGS. 8A and 8B show a schematic plan view and a schematic vertical cross-sectional view of a semiconductor device according to an embodiment with the complementary pad being connected to a drain ring structure.
Figure 8B:
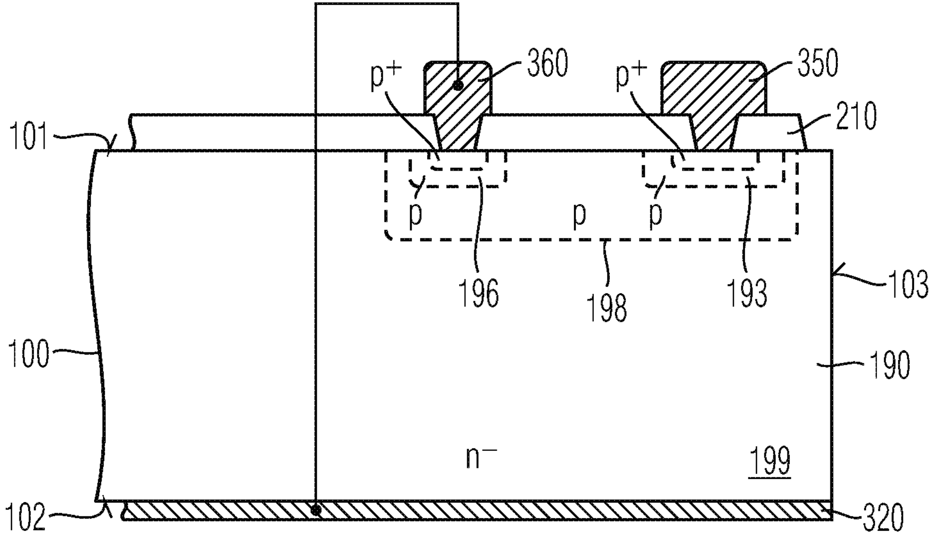

The semiconductor device 500 in FIGS. 8A and 8B further include a p doped resistor region 198 connecting the p doped probe contact region 193 and a p doped complementary contact region 196. The complementary pad 360 includes a drain ring 361 and a pad portion 362. The drain ring 361 is in contact with a ring-shaped n doped or p doped channel stopper region 1961. The pad portion 362 is in contact with the complementary contact region 196. The drain ring 361 and the backside electrode 320 on the second surface 102 may be electrically connected through a low-resistive ohmic path, e.g. a through contact via in one of the corner sections of the field-free region 190.

The pad portion 362 of the complementary pad 360 and the probe pad 350 may be formed in the same corner section 192 or in different, e.g. in neighboring corner sections 192 of the field-free region 190.

The drain ring 361 and the pad portion 362 may be connected through a stripe-shaped connection. Alternatively, the pad portion 362 may be formed as a bulge extending from the drain ring 361 to above the complementary pad region 196.

Each of the pad contact region 193 and the complementary pad region 196 has a more heavily doped section directly along the first surface 101 and in contact with the probe pad 350 or the complementary pad 360 and a more lightly doped section between the more heavily doped section and the resistor region 198.

By supplying a constant current flow through the resistor region 198 and measuring a voltage drop between the probe pad 350 and the complementary pad 360 or by supplying a constant voltage across the resistor region 198 and measuring a current through the resistor region 198 the electrical resistance of the resistor region 198 is measured. From the resistance of the resistor region 198 information about the temperature is obtained.

Since the complementary pad 360 is accessible through the backside electrode 320 only one additional terminal is required.

Figure 9A:
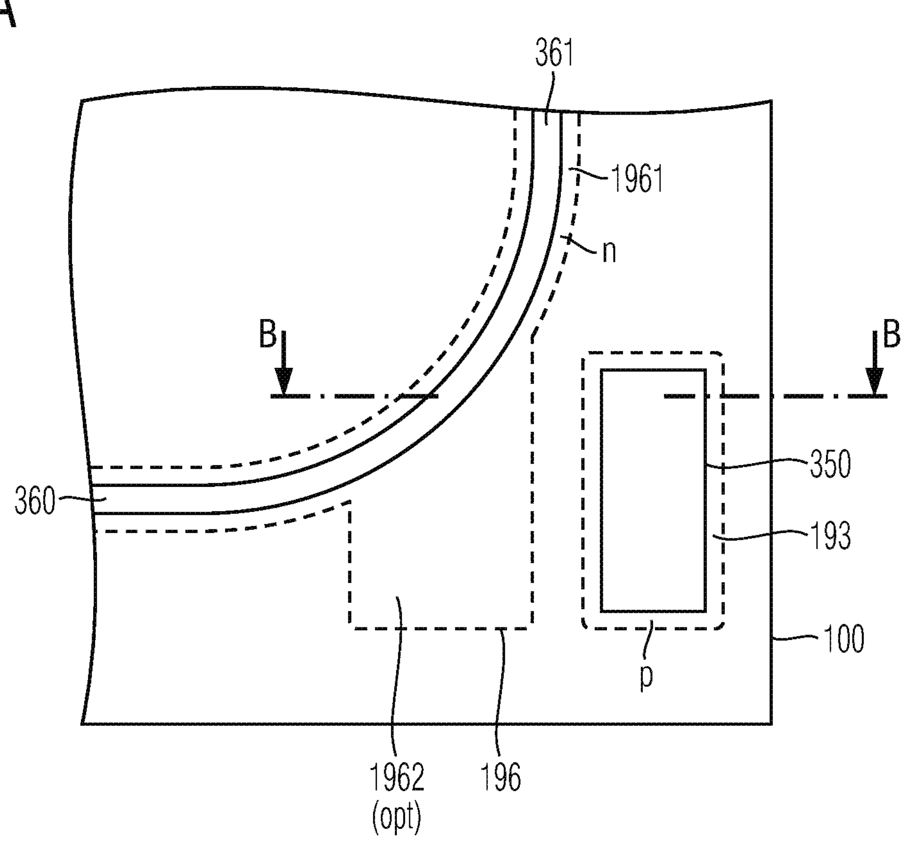
FIGS. 9A to 9B show two schematic plan views and a schematic vertical cross-sectional view of a semiconductor device according to an embodiment with the probe pad and the complementary pad formed in different angle portions of the field-free region.
Figure 9B:
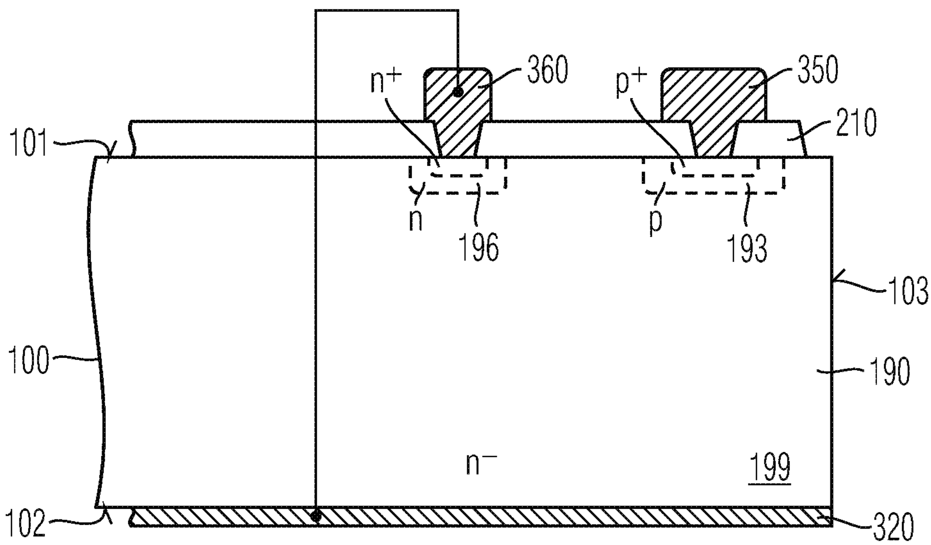

In FIGS. 9A and 9B a portion of the n doped main portion 199 connects the p probe contact region 193 and an n doped complementary contact region 196. The complementary pad 360 includes only the drain ring 361, which is in contact with a ring-shaped n doped channel stopper region 1961. The complementary contact region 196 may include a lateral extension 1962 of the n doped channel stopper region 1961 as illustrated. Alternatively, the lateral extension 1962 may be omitted and the complementary contact region 196 includes only the n doped channel stopper region 1961.

Each of the pad contact region 193 and the complementary pad region 196 has a more heavily doped section directly along the first surface 101 and in contact with the probe pad 350 or the complementary pad 360 and a more lightly doped section between the more heavily doped section and the main portion 199 of the field-free region 190.

By supplying a voltage ramp between the probe pad 350 and the complementary pad 360 and measuring the current between the probe pad 350 and the complementary pad 360, a knee voltage of the pn junction is measured. Since the knee voltage strongly depends on the temperature around the pn junction, information about the temperature can be obtained.

Since the complementary pad 360 is accessible through the backside electrode 320 only one additional terminal is required.

Figure 10:
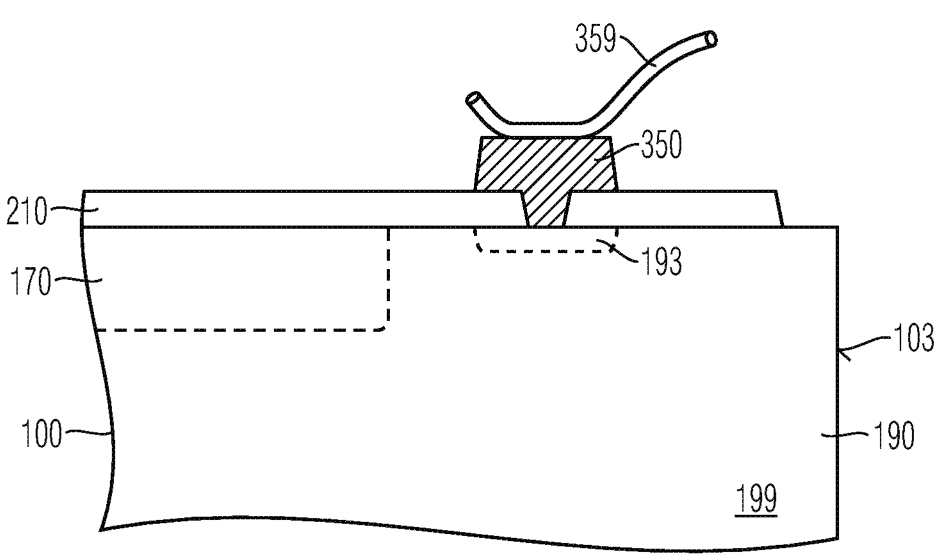
FIG. 10 shows a schematic vertical cross-sectional view of a semiconductor device according to an embodiment with a bond wire connected to the probe pad.

FIG. 10 shows a semiconductor device 500 with a bond wire 359 bonded onto the horizontal contact surface of the probe pad 350. The bond wire 359 may connect the probe pad 350 with a test terminal of the semiconductor device 500. In case the semiconductor device 500 is a bare die integrated in a module, the bond wire 359 may connect the probe pad 350 with a bond support structure in the module or with a terminal of a measurement circuit.

Figure 11:
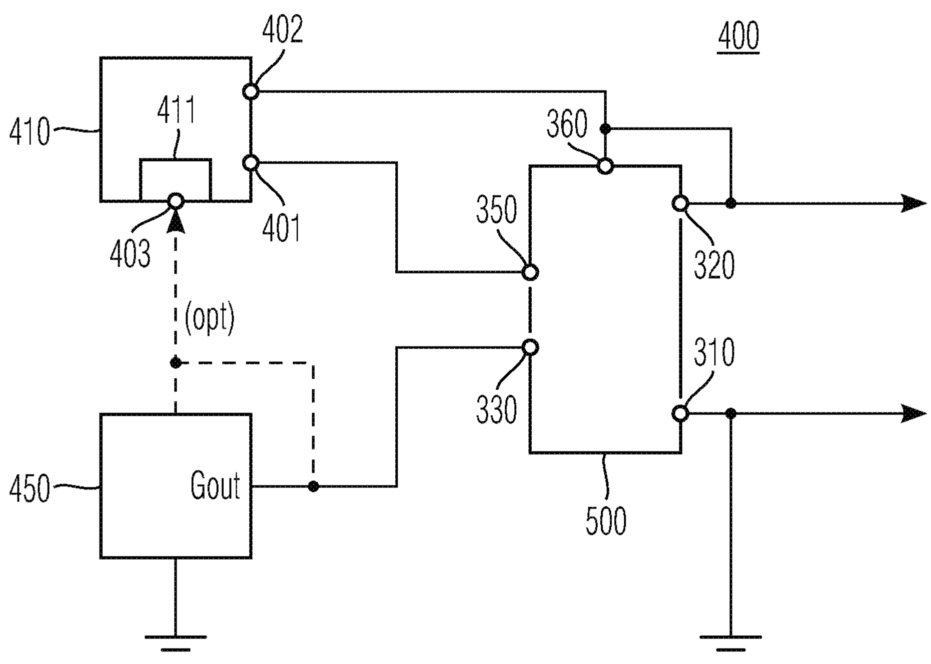
FIG. 11 shows a schematic block diagram of a semiconductor assembly including a semiconductor device with a probe pad and a measurement circuit connected to the probe pad according to an embodiment.

FIG. 11 concerns a set-up for temperature sensing during operation of a semiconductor device 500.

A semiconductor assembly 400 includes a semiconductor device 500, a gate driver circuit 450 and a measurement circuit 410. The semiconductor device 500 may be a MOSFET or IGBT and includes a front side electrode 310, a backside electrode 320, a gate electrode 330 and a probe pad 350. In addition, the semiconductor device 500 may include a complementary pad 360.

An output of the gate driver circuit 450 and the gate electrode 330 of the semiconductor device 500 are electrically connected. The gate driver circuit 450 generates a gate signal and passes the gate signal to the semiconductor device 500.

The measurement circuit 410 includes a first test port 401 and a second test port 402. The first test port 401 and the probe pad 350 are electrically connected. The second test port 402 and the backside electrode 320 are electrically connected. In case the semiconductor device 500 includes a complementary pad 360, the second test port 402 may be electrically connected with the complementary pad 360.

The measurement circuit 410 may supply a test voltage between the first test port 401 and the second test port 402 and simultaneously may measure a current delivered or absorbed through the first test port 401. Alternatively or in addition, the measurement circuit 400 may deliver a test current to the first test port 401 or the second test port and may simultaneously measure a voltage between the first test port 401 and the second test port 402.

The test voltage and/or test current may be constant for a measurement period, e.g. for measuring an electric resistance effective between the probe pad 350 and the complementary pad 360 or between the probe pad 350 and the backside electrode 320.

Alternatively, the test voltage and/or test current may be decreased or increased at a constant rate for a measurement period, e.g. for determining a knee voltage of a pn junction between the probe pad 350 and the complementary pad 360 or between the probe pad 350 and the backside electrode 320.

The measurement circuit 410 may include a control input 403 and a timing circuit 411. Through the control input 403 the timing circuit 411 receives information about the switching state of the semiconductor device 500. For example, the gate driver 450 may pass the gate signal or another signal to the control input 403. The timing circuit 411 synchronizes the measurement periods with the switching state of the semiconductor device 500.

For example, the timing circuit 411 provides measurement periods exclusively in the off-state (blocking state) of the semiconductor device 500. In particular in case the semiconductor device 500 is an IGBT, performing the measurement right after transition to the blocking state ensures that the measurement is not disturbed or affected by the charge carrier plasma which forms in the on-state.

The semiconductor assembly 400 may be operated as follows: The measurement circuit 410 obtains data about the temperature of the semiconductor device 500 by in-situ measurement of a temperature-dependent knee voltage of a pn junction between the probe pad 350 and the complementary pad 360 or between the probe pad 350 and the backside electrode 320. Alternatively or in addition, the measurement circuit 410 determines data about the temperature of the semiconductor device 500 by in-situ measurement of a temperature-dependent resistance between the probe pad 350 and the complementary pad 360 or between the probe pad 350 and the backside electrode 320. The measurement circuit 410 outputs the temperature data on demand, in regular intervals, or when the temperature data fulfills a predefined condition. In particular, the measurement circuit 410 may pass the temperature data to a monitoring unit.

The monitoring unit receives the temperature data. On the basis of the received temperature date the monitoring unit may compute a cumulated thermal stress the semiconductor device 500 has been exposed to in its lifetime. Alternatively or in addition, the monitoring unit may check the temperature data for abnormalities that may indicate a faulty condition such as a degraded cooling mechanism. The monitoring unit outputs cumulated thermal stress data and/or data indicating abnormalities.

The measurement circuit 400 may be connected directly to the load electrode 310, 320 of the tested semiconductor device 500 or to another conductive structure which is electrically connected to the respective load electrode 310, 320. The other conductive structure may be a load electrode of a further semiconductor device, wherein the load electrode of the further semiconductor device and the load electrode 310, 320 of the tested semiconductor device are directly electrically connected, e.g. through a bond wire.

Determining the thermal stress data may include assessment of the temperature measurement exclusively in measurement periods synchronized with transitions to the off-state of the semiconductor device 500.

Figure 12:
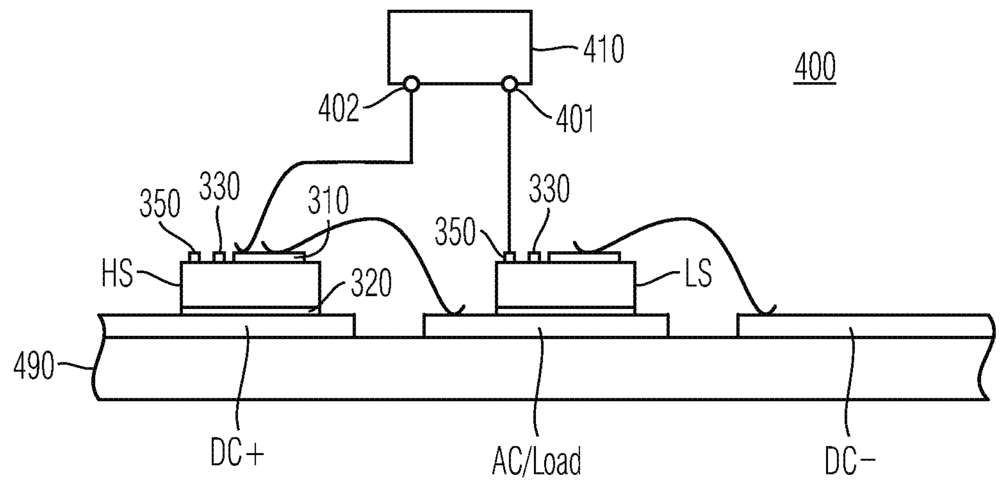
FIG. 12 shows a schematic block diagram of a semiconductor assembly including a semiconductor device with a probe pad and a measurement circuit connected to the probe pad according to an embodiment related to a half-bridge driver circuit.

FIG. 12 refers to semiconductor assembly 400 with two semiconductor switches HS, LS in a half-bridge configuration. Each of the semiconductor switches HS, LS may be a semiconductor device 500 as described above.

Load conductor structures DC+, AC/Load, and DC− are formed on a component side of a substrate 490, wherein the substrate 490 may be a PCB (printed circuit board) or DBC (direct bonded copper) substrate, by way of example. The high side semiconductor switch HS is placed on the DC+ conductor structure, wherein the backside electrode 320 of the high side semiconductor switch HS is connected with the DC+ conductor. The low side semiconductor switch LS is placed on the AC/Load conductor, wherein the backside electrode 320 of the low side semiconductor switch LS is connected with the AC/Load conductor. A clip or bond wires connect the front side electrode 310 of the high side semiconductor switch HS with the AC/Load conductor. A further clip or further bond wires connect the front side electrode 310 of the low side semiconductor switch LS with the DC-conductor.

The first test port 401 of the measurement circuit 410 is electrically connected with the probe pad 350 of the low side semiconductor switch LS. The second test port 402 of the measurement circuit 410 is electrically connected with the front side electrode 310 of the high side semiconductor switch HS in order to avoid high voltage swings and high voltage measurement efforts. Since temperature differences between the high side semiconductor switch HS and the low side semiconductor switch LS are small on a time scale much higher than 1/(switching frequency), the temperature of the low side semiconductor switch LS can be used as image of the temperature of the high side semiconductor switch HS and to detect creeping temperature increase e.g. due to overload or malfunction of the cooling.

Figure 13:
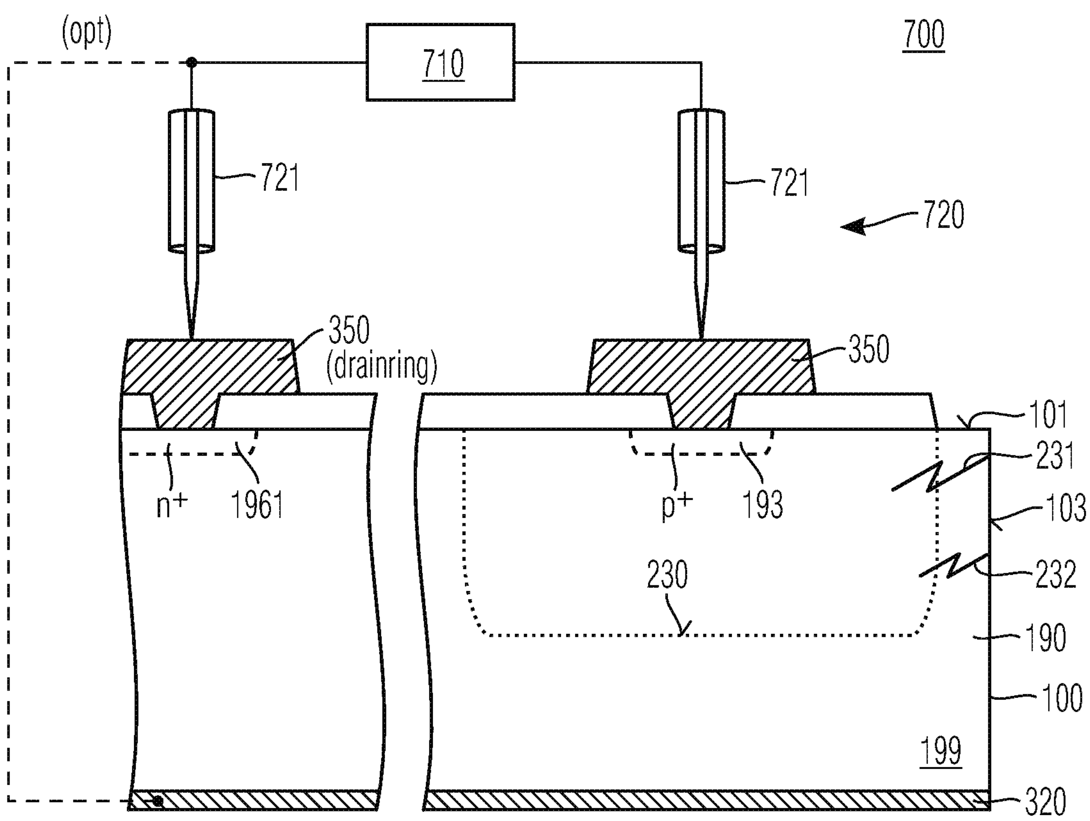
FIG. 13 shows a schematic block diagram of a test assembly with probes contacting the probe pad and the drain ring according to another embodiment.

FIG. 13 concerns a test setup for leakage current measurements in a test facility. A semiconductor test assembly 100 includes a semiconductor device 500 with a probe pad 350. The semiconductor device 500 further includes a complementary pad 360 at the front side and/or a backside electrode 320 at a side opposite to the front side. A test adapter 720 includes a needle probe 721 configured to make electric contact with the probe pad 350 in a probe contact state. The test adapter 720 may include a second needle probe 721 configured to make electric contact with the probe pad 350 in the probe contact state and/or a probe connectable to the backside electrode 320 at least in the probe contact state. A leakage current measurement device 710 applies a test voltage that reverse biases a pn junction formed along the probe contact region and measures a leakage current delivered or absorbed through the probe pad 350.

What is claimed is:

1. A semiconductor device, comprising:

a semiconductor portion with a first surface at a front side, wherein the semiconductor portion comprises an active area, a termination structure laterally surrounding the active area, and a field-free region between the termination structure and a lateral outer surface of the semiconductor portion, wherein the field-free region comprises a probe contact region and a main portion, and wherein the probe contact region and the main portion form a pn junction;

a probe pad on the first surface, wherein the probe pad and the probe contact region form an ohmic contact; and a passivation layer on the first surface, wherein the passivation layer is formed at least on the termination structure and exposes the probe pad.

2. The semiconductor device of claim 1, wherein the probe pad has one horizontal contour line forming a closed shape.

3. The semiconductor device of claim 1, further comprising:

a backside electrode formed on a second surface of the semiconductor portion opposite to the front side, wherein the backside electrode and the probe pad are electrically separated.

4. The semiconductor device of claim 1, wherein a lateral outer contour of the termination structure is rectangular with rounded corners, and wherein the field-free region includes straight sections of uniform width along straight edges of the termination structure and corner sections laterally connecting neighboring straight sections.

5. The semiconductor device of claim 4, wherein the probe pad is formed in one of the corner sections of the field-free region.

6. The semiconductor device of claim 1, wherein the probe contact region comprises a surface portion extending from the first surface into the semiconductor portion.

7. The semiconductor device of claim 1, wherein the probe contact region comprises a ring-shaped portion laterally surrounding the active area and the field termination structure at a distance to the lateral outer surface.

8. The semiconductor device of claim 1, further comprising:

a complementary pad on the first surface, wherein the complementary pad and the field-free region form an ohmic contact.

9. The semiconductor device of claim 8, further comprising:

a backside electrode formed on a second surface of the semiconductor portion opposite to the front side, wherein the complementary pad and the backside electrode are electrically connected.

10. The semiconductor device of claim 8, wherein the field-free region comprises a complementary contact region of the conductivity type of the probe contact region, and wherein the complementary pad and the complementary contact region form an ohmic contact.

11. The semiconductor device of claim 10, wherein the field-free region comprises a resistor region of the conductivity type of the probe contact region, and wherein the resistor region connects the probe contact region and the complementary contact region.

12. The semiconductor device of claim 9, wherein the field-free region comprises a complementary contact region of the opposite conductivity type of the probe contact region, and wherein the complementary pad and the complementary contact region form an ohmic contact.

13. The semiconductor device of claim 1, further comprising:

a bond wire electrically connecting the probe pad with a further conductive structure.

14. The semiconductor device of claim 1, wherein the semiconductor portion comprises a semiconductor part formed from a group IV elemental semiconductor, silicon germanium, or a group III-V compound semiconductor.

15. A semiconductor device, comprising:

a semiconductor portion with a first surface at a front side, wherein the semiconductor portion comprises an active area, a termination structure laterally surrounding the active area, and a field-free region between the termination structure and a lateral outer surface of the semiconductor portion, wherein the field-free region comprises a probe contact region and a main portion, and wherein the probe contact region and the main portion form a semiconductor junction;

a probe pad on the first surface, wherein the probe pad and the probe contact region form an ohmic contact; and a passivation layer on the first surface, wherein the passivation layer is formed at least on the termination structure and exposes the probe pad, wherein the probe contact region includes a buried portion formed along at least a portion of a sidewall and/or a bottom of a trench extending from the first surface into the field-free region.

16. The semiconductor device of claim 15, wherein the trench is a filled trench.

17. The semiconductor device of claim 15, wherein the trench is a non- filled trench.

18. A semiconductor device, comprising:

a semiconductor portion with a first surface at a front side, wherein the semiconductor portion comprises an active area, a termination structure laterally surrounding the active area, and a field-free region between the termination structure and a lateral outer surface of the semiconductor portion, wherein the field-free region comprises a probe contact region and a main portion, and wherein the probe contact region and the main portion form a semiconductor junction;

a probe pad on the first surface, wherein the probe pad and the probe contact region form an ohmic contact; and a passivation layer on the first surface, wherein the passivation layer is formed at least on the termination structure and exposes the probe pad, wherein the probe contact region includes a buried portion formed along a bottom of a filled trench that extends from the first surface into the field-free region.

19. The semiconductor device of claim 18, wherein the filled trench includes a conductive material such that the buried portion of the probe contact region and the probe pad are electrically connected.

* * * * *